United States Patent
Reise et al.

(10) Patent No.: US 6,678,625 B1
(45) Date of Patent: Jan. 13, 2004

(54) METHOD AND APPARATUS FOR A MULTIPURPOSE CONFIGURABLE BUS INDEPENDENT SIMULATION BUS FUNCTIONAL MODEL

(75) Inventors: Brian G. Reise, Colorado Springs, CO (US); David W. Carpenter, Monument, CO (US)

(73) Assignee: LSI Logic Corporation, Milpitas, CA (US)

( * ) Notice: Subject to any disclaimer, the term of this patent is extended or adjusted under 35 U.S.C. 154(b) by 273 days.

(21) Appl. No.: 09/751,760

(22) Filed: Dec. 29, 2000

Related U.S. Application Data

(63) Continuation-in-part of application No. 09/624,060, filed on Jul. 24, 2000.

(51) Int. Cl.$^7$ ................................................ G06F 13/00
(52) U.S. Cl. ...................................................... 702/117
(58) Field of Search ........................... 702/117; 703/20; 710/100, 243, 109; 370/395; 307/88; 395/701

(56) References Cited

U.S. PATENT DOCUMENTS

| | | | |
|---|---|---|---|
| 4,710,893 A | * 12/1987 | McCutcheon et al. | 710/109 |
| 4,825,438 A | * 4/1989 | Bennett et al. | 710/100 |
| 5,568,407 A | * 10/1996 | Hass et al. | 702/118 |
| 5,648,973 A | * 7/1997 | Mote, Jr. | 714/727 |
| 6,072,798 A | * 6/2000 | Beasley | 370/395.72 |
| 6,123,735 A | * 9/2000 | Raghavan et al. | 703/20 |
| 6,154,715 A | * 11/2000 | Dinteman et al. | 702/120 |
| 6,321,352 B1 | * 11/2001 | Wasson | 714/724 |

OTHER PUBLICATIONS

Laung–Terng (L.–T.) Wang and Paul Y.–F. Wu, PATRIOT—A Boundary–Scan Test and Diagnosis System, 1992, Compcon Spring '92, Thirty–Seventh IEEE Computer Society International Conference, Digest of Papers, pp. 436–439.*

* cited by examiner

*Primary Examiner*—John Barlow
*Assistant Examiner*—Tung Lau
(74) *Attorney, Agent, or Firm*—Suiter-West PC LLO

(57) ABSTRACT

A multipurpose configurable bus independent simulation bus functional model for testing a circuit is described. The multipurpose bus functional model utilizes a configurable data structure to interact with a device being tested by providing high-level test generation routines defined by the bus interface specified. The configurable data structure allows for verification of both signal timing and functional operation bus specifications. This data structure technique utilizes a standardized and parameterized method that allows variations and multiple instances of test bench models to be generated and instantiated in a design test environment. The bus functional model also sub-divides general functions and data structures into separate re-usable functional blocks. It is emphasized that this abstract is provided to comply with the rules requiring an abstract that will allow a searcher or other researcher to quickly ascertain the subject matter of the technical disclosure. It is submitted with the understanding that it will not be used to interpret or limit the scope or meaning of the claims.

49 Claims, 8 Drawing Sheets

METHOD AND APPARATUS FOR A MULTIPURPOSE CONFIGURABLE BUS INDEPENDENT SIMULATION BUS FUNCTIONAL MODEL

CROSS REFERENCE TO RELATED APPLICATIONS

The present invention is a continuation-in-part of U.S. patent application Ser. No. 09/624,060, filed on Jul. 24, 2000. Said application Ser. No. 09/624,060 is hereby incorporated herein in its entirety.

BACKGROUND

A Bus Functional Model (BFM) tests stimulus-response interaction, including timing, of the bus operation of a modeled device. Many BFM's also include control mechanisms to generate read cycles, write cycles, idle cycles, read-modify-write cycles, cache hits, cache misses, interrupts, interrupt acknowledgments, direct memory access calls, and the like. Thus, a BFM is a tool providing system designers with a method of designing and debugging components and systems. Further, by utilizing a BFM a system designer may be aided in verifying component/system function prior to fabrication. Therefore, a BFM may be utilized to define the operation of a component/system interface with respect to its surrounding environment (i.e., one or more busses). By utilizing a BFM the interface between components in a system environment may be modeled in detail and data, timing, and functional checks may be monitored for errors. In this fashion a BFM may be readily utilized to demonstrate the functionality of a hardware design. However, a standardized, parameterized, and re-usable BFM which may be readily configured for multiple device models and design verification test benches in a design verification test environment is not available. Therefore, it would be desirable to provide a BFM capable of configuration for multiple device models and design verification test benches.

SUMMARY

The present invention is directed to a Bus Functional Model (BFM) method and system and more particularly to an adaptable BFM capable of configuration for multiple device models and design verification test benches. Current BFM's are customized for a specific function/task (component, system) and usually require extensive re-coding to be utilized in modeling similar components/systems. The BFM method and system of the present invention utilizes a standardized and parameterized BFM data structure. As a result of this standardized and parameterized BFM data structure, variations and multiple instances of test bench models may be generated and instantiated in a design test environment. Thus, the present invention may be utilized to save development time, simplify code maintenance, and allow for modeling additional component/system features.

In operation, the universal BFM of the present invention sub-divides unique functions and data structures into separate blocks. For example, standardized data structures may be re-used within said standardized individual functional blocks for various functions and tasks (components, systems). Thus, for each behavioral BFM instantiated (or implemented) in a simulation design test bench environment, the device model structure of the present invention operates as a master and/or slave device so as to configure itself based on the bus interface requirements specified. In this regard the BFM of the present invention is capable of generating simulation run-time parameters based upon the operational characteristics of the interacting elements of the component/system being tested.

BRIEF DESCRIPTION OF THE DRAWINGS

The numerous advantages of the present invention may be better understood by those skilled in the art by reference to the accompanying figures in which.

DETAILED DESCRIPTION

Reference will now be made in detail to the presently preferred embodiment of the invention, an example of which is illustrated in the accompanying drawings.

Figure 1:
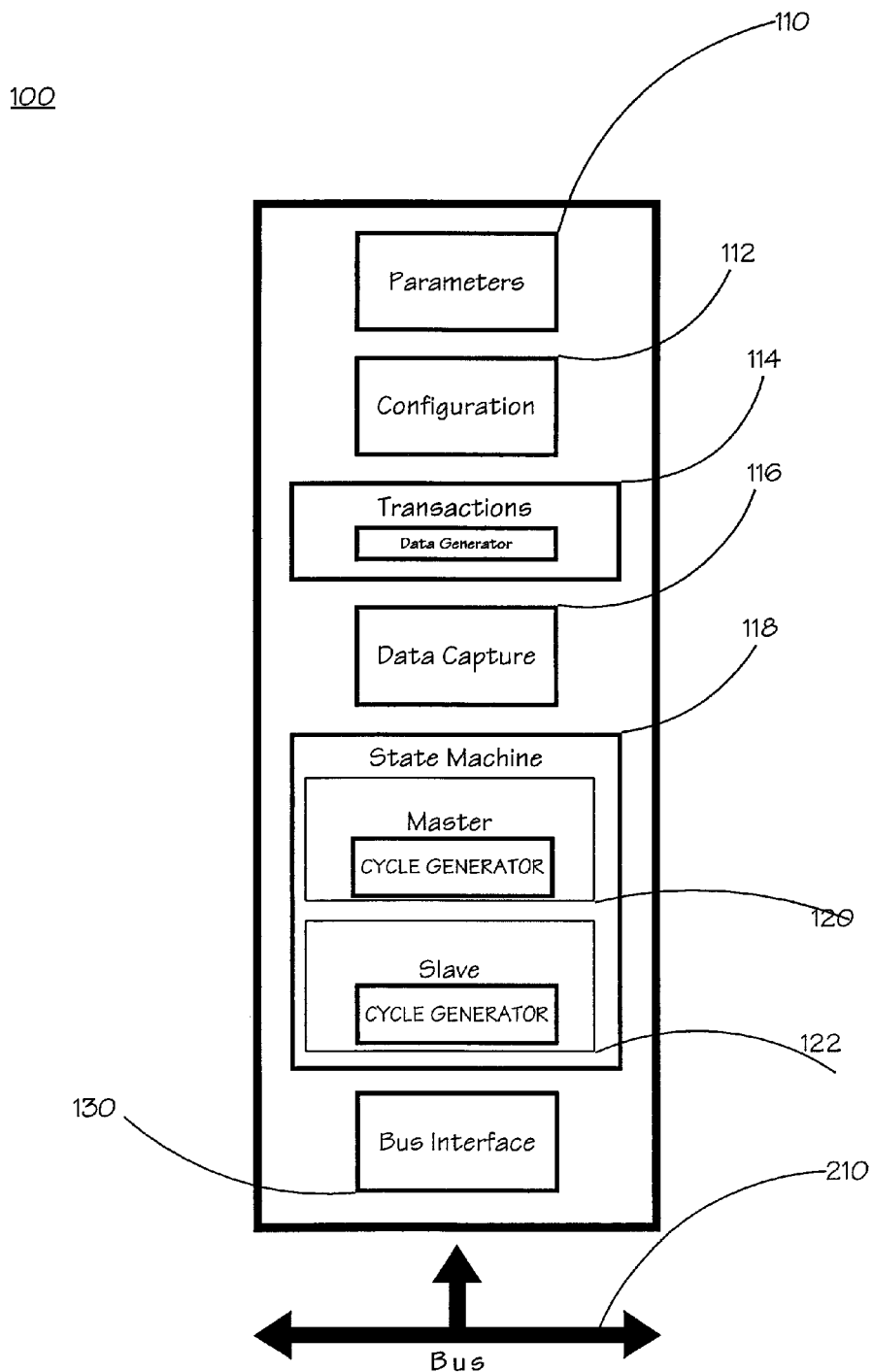
FIG. 1 is a block diagram of a preferred embodiment of the multipurpose configurable bus independent simulation bus functional model of the present invention.
Figure 5:
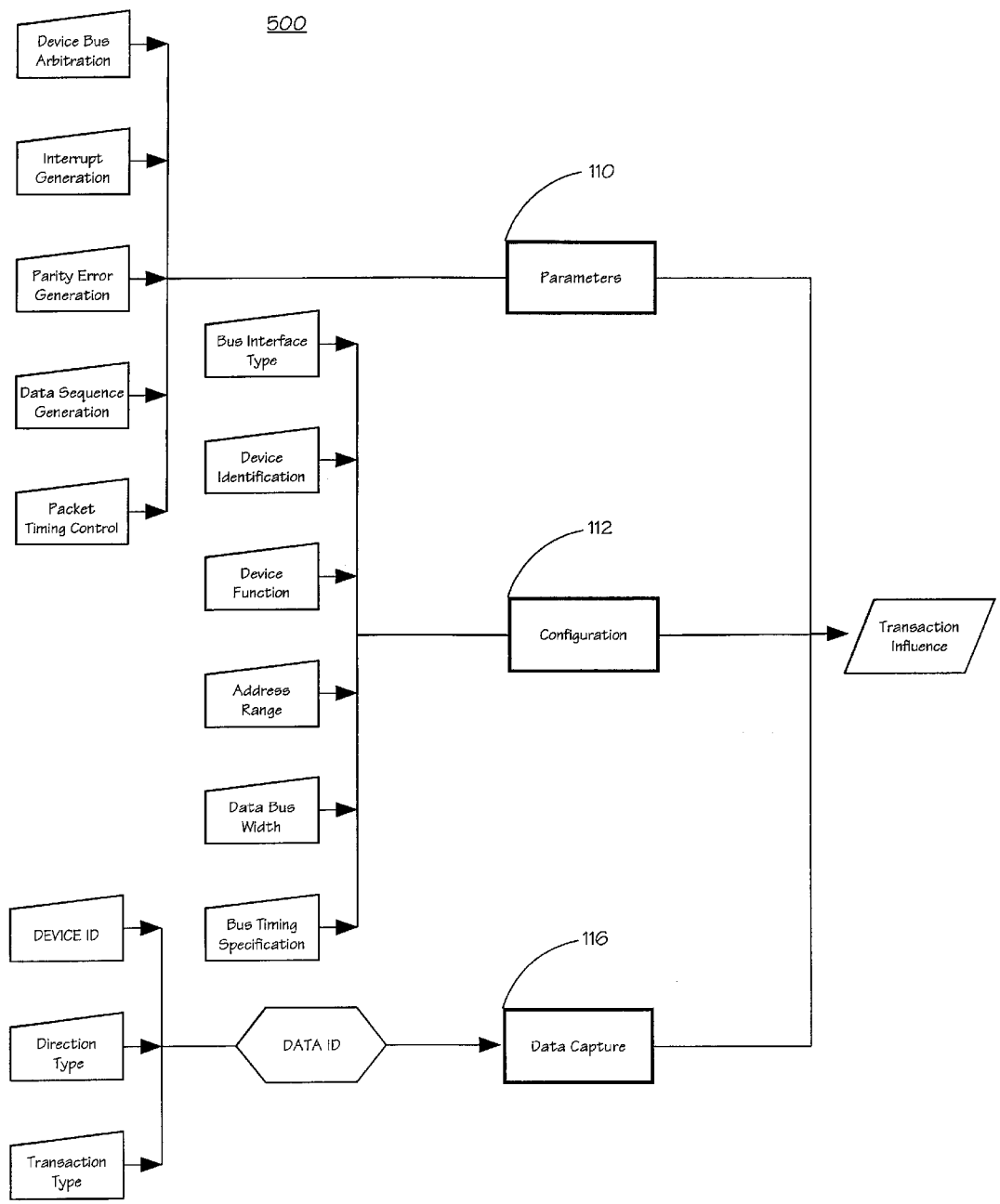
FIG. 5 is a flow diagram of the influence of the data structure on a transaction of a preferred embodiment of the multipurpose configurable bus independent simulation bus function model.
Figure 6:
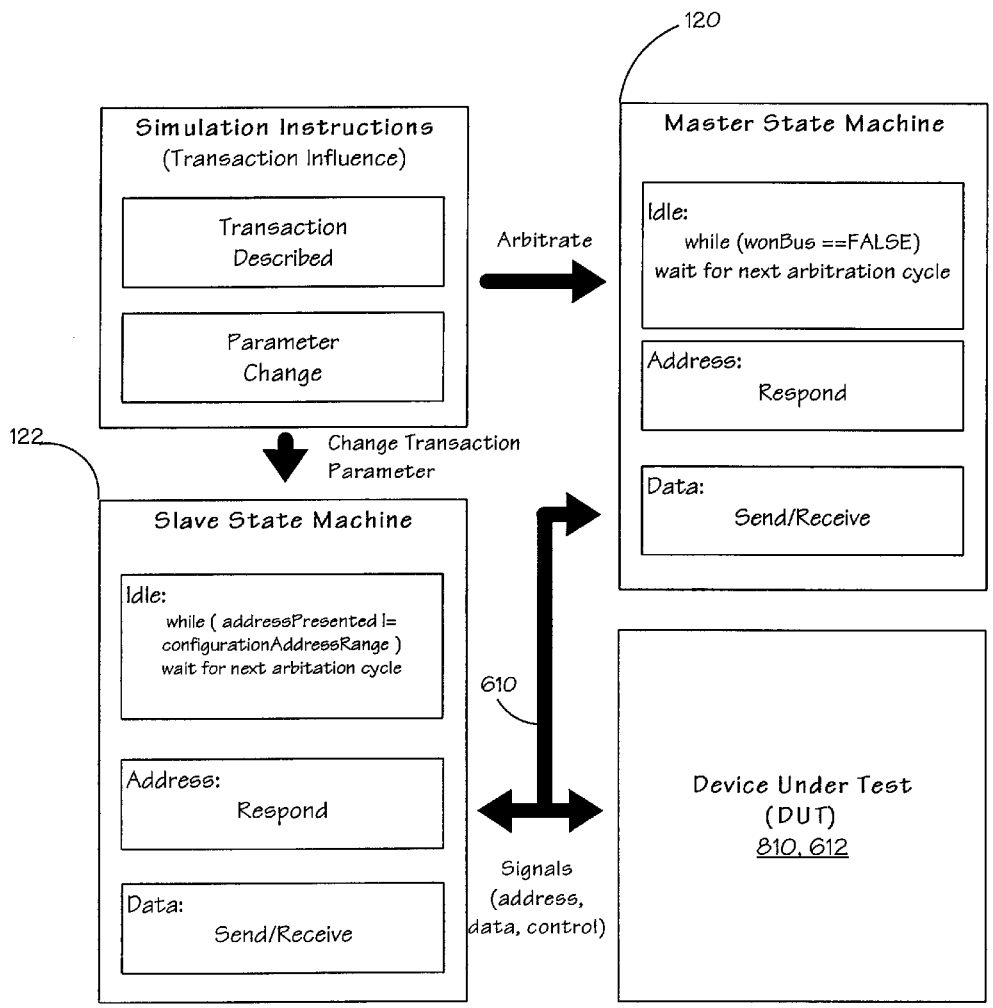
FIG. 6 is a block diagram illustrating a preferred embodiment of the multipurpose configurable bus independent simulation bus function model in a Peripheral Component Interconnect (PCI) environment.
Figure 7:
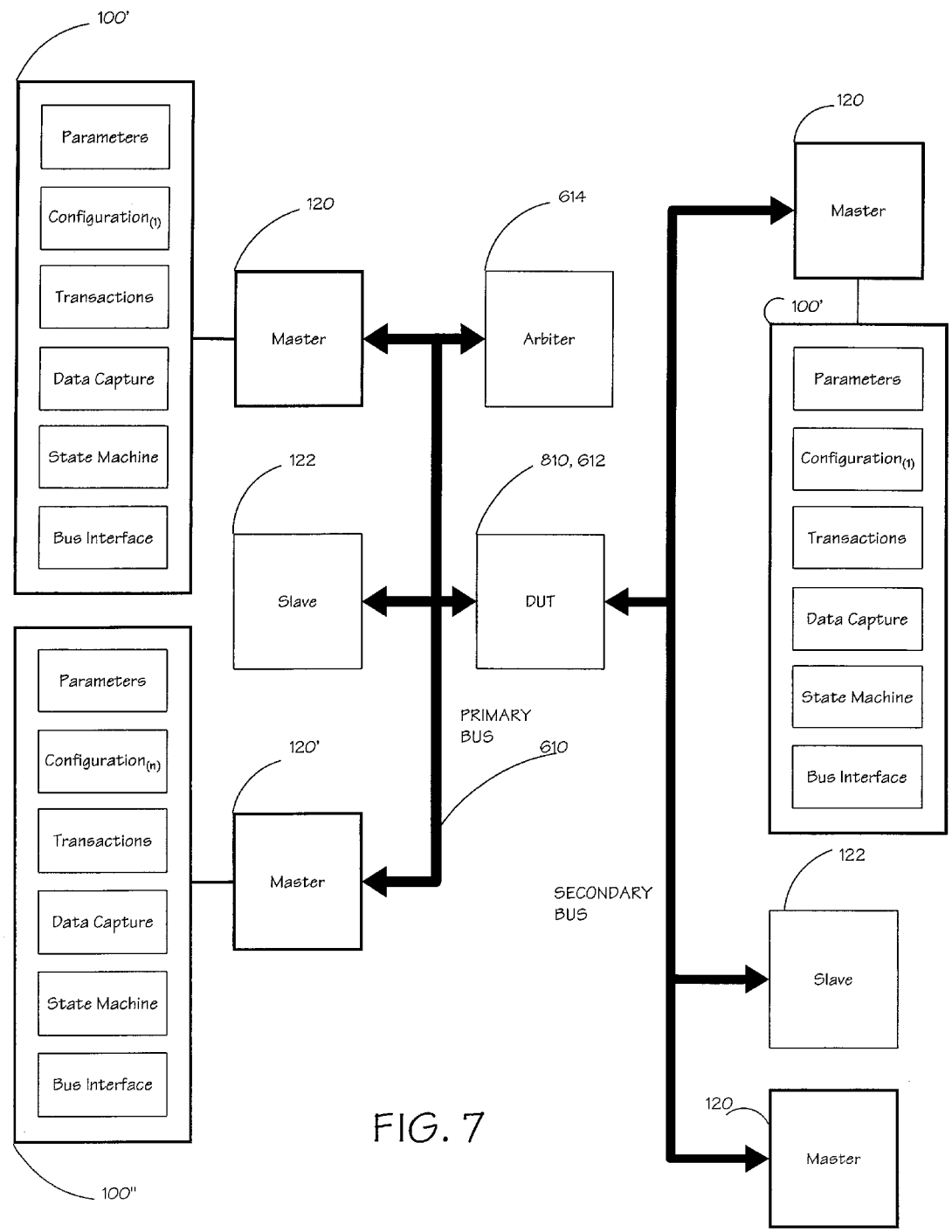
FIG. 7 is a block diagram illustrating a preferred embodiment of the multipurpose configurable bus independent simulation bus function model in a exemplary simulation test bench environment.

Referring now to FIG. 1, a block diagram of a preferred embodiment of the multipurpose configurable stimulation bus functional model 100 of the present invention is shown, wherein the parameters 110, configuration 112, transactions 114, data capture 116, and state machine 118 (and bus interface 130) are illustrated in block format. In such a preferred embodiment the parameters block 110 (of the data structure) define certain bus 210 and data related parameters such as bus arbitration, bus interrupts, data parity, data types, data interval timers, and the like (FIG. 5). With these parameters a preferred embodiment of the present invention 100 may be utilized to directly control how a Device Under Test (DUT) 612 will respond to, for example: (1) being selected by other devices on a bus during an arbitration phase/sequence (614); (2) generation of unexpected interrupt conditions; (3) generation of parity errors; (4) generation of expected/unexpected data sequences; and (5) data packet interval timing controls. Additionally, these and other parameters may be specified and controlled by utilizing both nonvariable and variable constraints during both directed and pseudo-random testing (FIGS. 6 and 7).

The configuration block 112 (of the data structure) of the present invention 100 utilizes certain fields to identify the device type to be emulated during a test (FIG. 5). These fields preferably include: (1) the bus interface type (e.g., PCI, SCSI, or the like); (2) the bus device identification (DEVICE ID) utilized to identify it from other instantiated devices on the bus; (3) the bus device function type (e.g., master, slave or the like); (4) the data bus width; and (5) bus 210 timing specifications such as setup, hold, transfer periods, latency, and the like.

In a preferred embodiment 100 the data structure transactions 114 contains instructions to be executed according to the bus specification, command type (e.g., read, write, or the like), a memory address, and a byte count. The data generator then creates data patterns in the format specified by the parameters previously defined.

In operation, the general purpose BFM may include, as an example, a device configuration as (constraints placed in the configuration block 112):

//PCI Master BFM
    busId=1;
    busType=PCI;
    busSize=64;
    busFunction=Master;
    addressRangeLow=0;
    addressRangeHigh=0;
//PCI Slave BFM
    busId=2;
    busType=PCI;
    busSize=64;
    busFunction=Slave;
    addressRangeLow=1000;
    addressRangeHigh=2000;
//SCSI Master BFM
    busId=0;
    busType=SCSI;
    busSize=16;
    busFunction=Master;
    addressRangeLow=0;
    addressRangeHigh=0;
//SCSI Slave BFM
    busId=1;
    busType=SCSI;
    busSize=16;
    busFunction=Slave;
    addressRangeLow=2000;
    addressRangeHigh=2000;

In the before set forth example the configuration values/types have been set (constrained) at the highest test pattern level. Other configurations may be employed depending on simulation requirements.

Data capture block 116 (FIG. 5) is preferably defined by the data format of each data transfer (e.g., byte, word, or the like). In operation, for example, as data is captured at the bus 210 interface and tagged with identification information (DATA ID), including for example: (1) data directional type (e.g., incoming, outgoing, or the like); (2) a data transaction number for a particular device; and (3) the DEVICE ID. In this fashion the DATA ID allows the data to be identified to a particular device. Preferably the captured data and its associated fields (e.g., DATA ID) are stored as a list or the like for utilization in data integrity checks by a test bench model.

The multipurpose configurable stimulation bus functional model 100 further includes a state machine 118 having both a master 120 and/or slave 122 functions (FIGS.1, 6, and 7). Thus, depending on how the BFM bus device is configured (as defined, e.g., by a configuration block data structure, either or both types of functions (master, slave) may be instantiated. In such an embodiment both master and slave blocks are preferably responsible for functional implementation of the bus interface protocol. In this model configuration, these blocks drive signals, capture data, and store data utilizing the parameters defined in the data capture block. Preferably, when driving data, the embedded cycle generators format the data according to the parameters defined by the parameters block 110.

Figure 2:
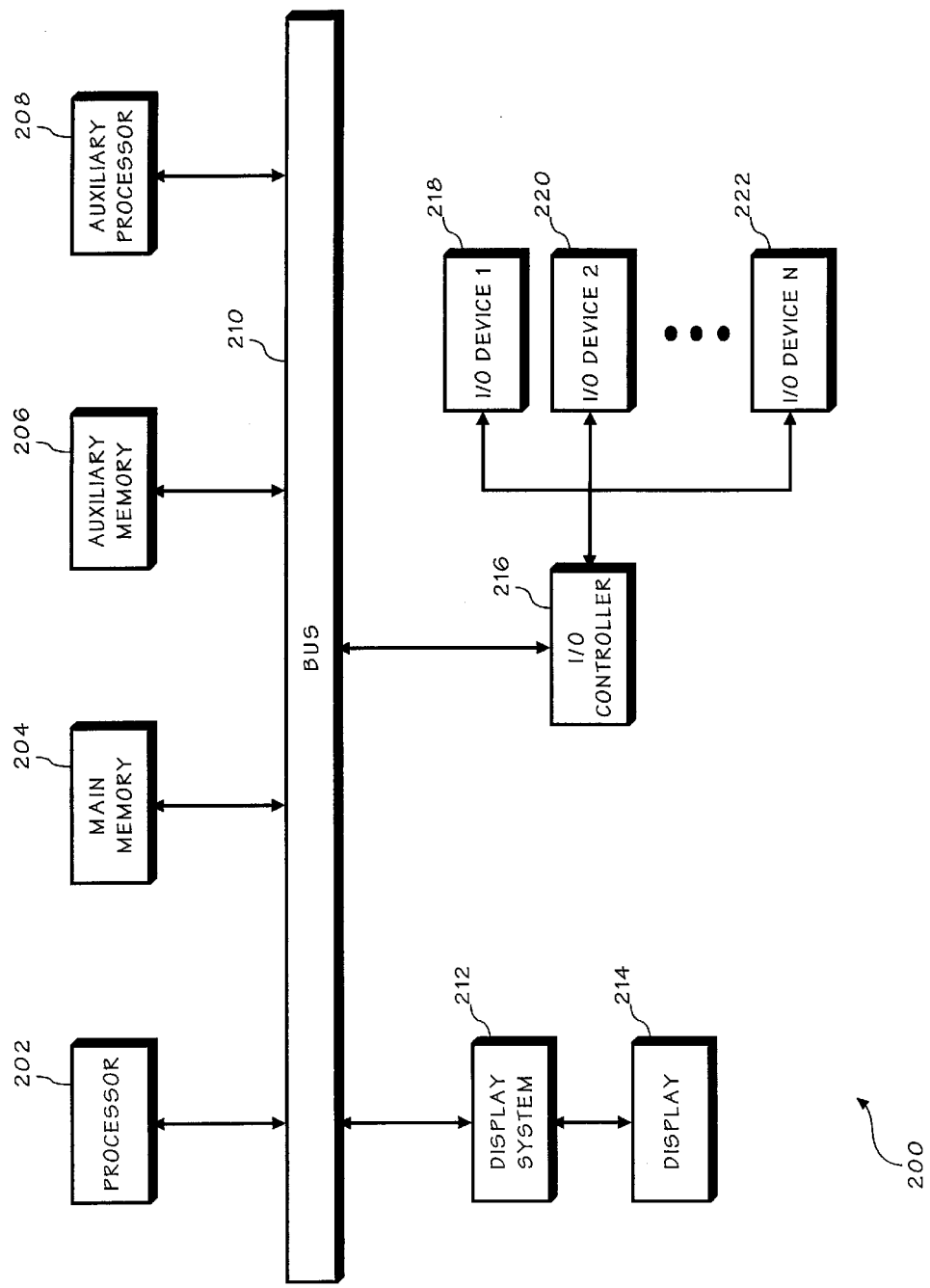
FIG. 2 is a block diagram of a computer system operable to embody the present invention.

Referring now to FIG. 2, a hardware system for use in cooperation with the data structure 100 of the multipurpose configurable bus independent simulation bus functional model of the present invention is shown. The hardware system shown in FIG. 2 is generally representative of the hardware architecture of a computer system. Computer system 200 may be configured to implement the data structure of the multipurpose bus functional model 100 of FIG. 1, for example, by executing a program of instructions. A central processor 202 controls the computer system 200. Central processor 202 includes a central processing unit such as a microprocessor or microcontroller for executing programs, performing data manipulations and controlling the tasks of computer system 200. Communication with central processor 202 is implemented through a system bus 210 for transferring information among the components of computer system 200. Bus 210 may include a data channel for facilitating information transfer between storage and other peripheral components of computer system 200. Bus 210 further provides the set of signals required for communication with central processor 202 including a data bus, address bus, and control bus. Bus 210 may comprise any state of the art bus architecture according to promulgated standards, for example industry standard architecture (ISA), extended industry standard architecture (EISA), Micro Channel Architecture (MCA), peripheral component interconnect (PCI) local bus, standards promulgated by the Institute of Electrical and Electronics Engineers (IEEE) including IEEE 488 general-purpose interface bus (GPIB), IEEE 696/S-100, and so on. Furthermore, bus 210 may be compliant with any promulgated industry standard. For example, bus 210 may be designed in compliance with any of the following bus architectures: Industry Standard Architecture (ISA), Extended Industry Standard Architecture (EISA), Micro Channel Architecture, Peripheral Component Interconnect (PCI), Universal Serial Bus (USB), Access.bus, EEE P1394, Apple Desktop Bus (ADB), Concentration Highway Interface (CHI), Fire Wire, Geo Port, or Small Computer Systems Interface (SCSI), for example.

Other components of computer system 200 include main memory 204, auxiliary memory 206, and an auxiliary processor 208 as required. Main memory 204 provides storage of instructions and data for programs executing on central processor 202. Main memory 204 is typically semiconductor based memory such as dynamic random access memory (DRAM) and or static random access memory (SRAM). Auxiliary memory 206 provides storage of instructions and data that are loaded into the main memory 204 before execution. Auxiliary memory 206 may include semiconductor-based memory such as read-only memory (ROM), programmable read-only memory (PROM) erasable programmable read-only memory (EPROM), electrically erasable read-only memory (EEPROM), or flash memory (block oriented memory similar to EEPROM). Auxiliary memory 206 may also include a variety of nonsemiconductor based memories, including but not limited to magnetic tape, drum, floppy disk, hard disk, optical, laser disk, compact disc read-only memory (CD-ROM), digital versatile disk read-only memory (DVD-ROM), digital versatile disk random-access memory (DVD-RAM), etc. Other varieties of memory devices are contemplated as well. Computer system 200 may optionally include an auxiliary processor 208, which may be a digital signal processor (a special-purpose microprocessor having an architecture suitable for fast execution of signal processing algorithms), a back-end processor (a slave processor subordinate to the main processing system), an additional microprocessor or controller for dual or multiple processor systems, or a coprocessor.

Computer system 200 further includes a display system 212 for connecting to a display device 214, and an input/output (I/O) system 216 for connecting to one or more I/O devices 218, 220, up to N number of I/O devices 222. Display system 212 may comprise a video display adapter having all of the components for driving the display device, including video random access memory (VRAM), buffer, and graphics engine as desired. Display device 214 may comprise a cathode ray-tube (CRT) type display such as a monitor or television, or may comprise alternative type of display technologies such as a liquid-crystal display (LCD), a light-emitting diode (LED) display, or a gas or plasma display. Input/output system 216 may comprise one or more controllers or adapters for providing interface functions between one or more of I/O devices 218–222. For example, input/output system 216 may comprise a serial port, parallel port, infrared port, network adapter, printer adapter, radio-frequency (RF) communications adapter, universal asynchronous receiver-transmitter (UART) port, etc., for interfacing between corresponding I/O devices such as a mouse, joystick, trackball, track pad, track stick, infrared transducers, printer, modem, RF modem, bar code reader, charge-coupled device (CCD) reader, scanner, compact disc (CD), compact disc read-only memory (CD-ROM), digital versatile disc (DVD), video capture device, touch screen, stylus, electro-acoustic transducer, microphone, speaker, etc.

Input/output system 216 and I/O devices 218–222 may provide or receive analog or digital signals for communication between computer system 200 of the present invention and external devices, networks, or information sources. Input/output system 216 and I/O devices 218–222 preferably implement industry promulgated architecture standards, including Recommended Standard 232 (RS-232) promulgated by the Electrical Industries Association, Infrared Data Association (IRDA) standards, Ethernet IEEE 802 standards (e.g., IEEE 802.3 for broadband and baseband networks, IEEE 802.3 z for Gigabit Ethernet, IEEE 802.4 for token passing bus networks, IEEE 802.5 for token ring networks, IEEE 802.6 for metropolitan area networks, 802.11 for wireless networks, and so on), Fibre Channel, digital subscriber line (DSL), asymmetric digital subscriber line (ASDL), frame relay, asynchronous transfer mode (ATM), integrated digital services network (ISDN), personal communications services (PCS), transmission control protocol/Internet protocol (TCP/IP), serial line Internet protocol/point to point protocol (SLIP/PPP), and so on. It should be appreciated that modification or reconfiguration of the present invention 100 of FIG. 1 by one having ordinary skill in the art would not depart from the scope or the spirit of the present invention.

Figure 3:
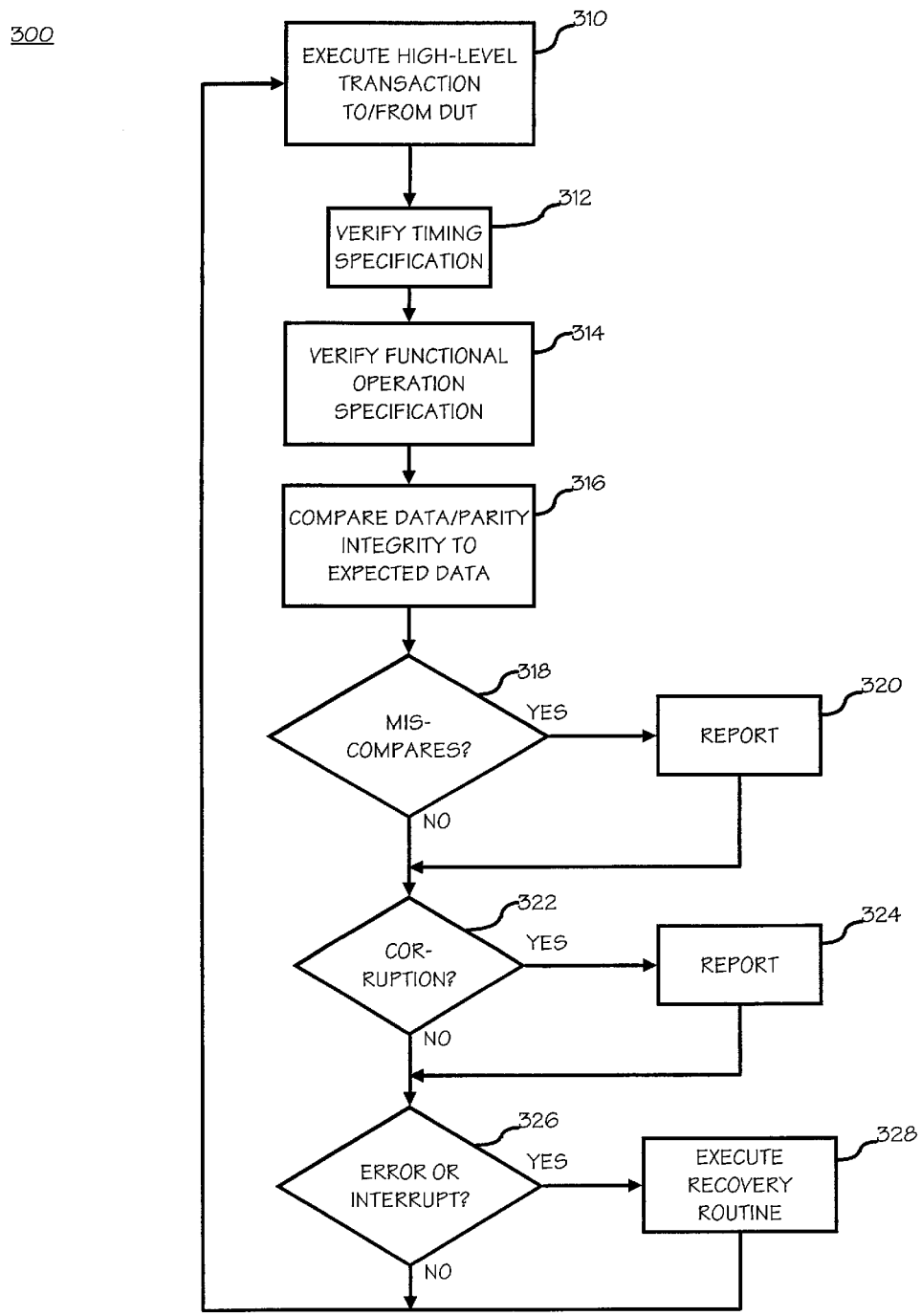
FIG. 3 is a flow diagram of a method for executing a test bench simulation in accordance with the present invention.
Figure 8:
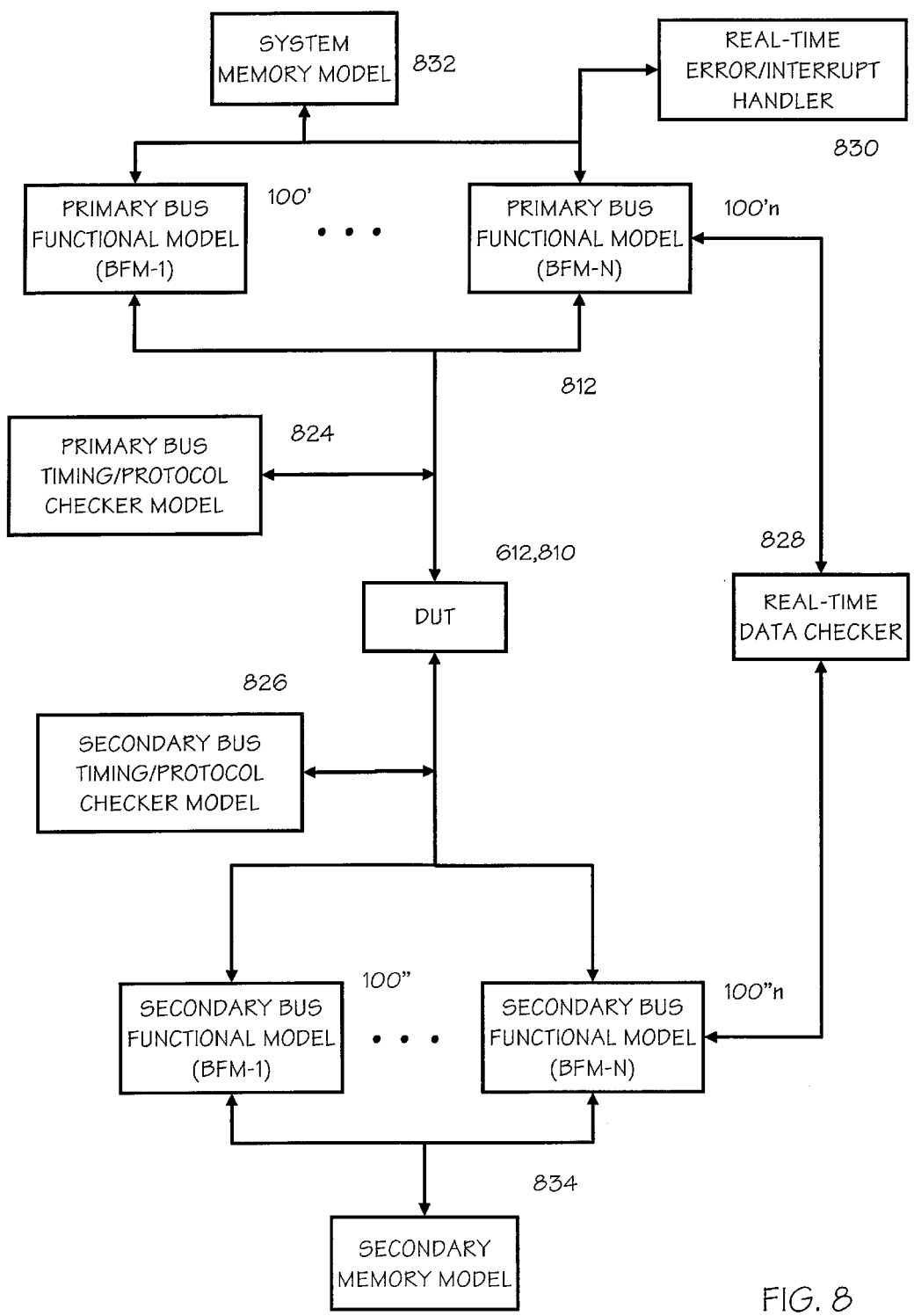
FIG. 8 is a flow diagram of a simulated test bench environment for verifying the design of a circuit in accordance with an exemplary embodiment of the present invention.

Referring now to FIGS. 3 and 8, a method for executing a test bench simulation in accordance with the present invention will be discussed. Although method 300 of FIG. 3 shows a particular order, the order need not be limited to the order shown, and more or fewer steps may be executed, without providing substantial change to the scope of the present invention. During execution of method 300, one or more state machines 118 of each bus functional model BFM-1, BFM-2, BFM-3, and BFM-4, execute a high-level transaction to or from DUT 612 (at step 310). A timing specification is verified at step 312 by timing/protocol checker model 824 (FIG. 8) for primary bus 812 (FIG. 8) and by timing/protocol checker 826 (FIG. 8) for secondary bus 820 (FIG. 8). Likewise, timing/protocol checker models 824 (FIG. 8) and 826 (FIG. 8) verify a functional operation specification of the respective bus at step 314. Data and parity integrity is compared to expected data at step 316 by real-time data checker 828 (FIG. 8). A determination is made at step 318 and at step 322 whether a miscompare or a corruption, respectively, is detected, in which case the miscompare or corruption is reported by real-time data checker 828 (FIG. 8) at respective steps 320 and 322. In one embodiment of the present invention, real-time data checker 828 is capable of checking for both data compares and corruption simultaneously. Timing, protocol, and data integrity checking are capable of being executed in parallel as independent threads such that primary bus timing and protocol checker 824 (FIG. 8), secondary bus timing and protocol checker 826 (FIG. 8), and real-time data checker 828 (FIG. 8) each monitor a respective bus and will trigger an event violation in the event a violation is detected. A determination is made at step 326 whether a system error or an interrupt condition is detected. In the event of a system error or an interrupt condition, real-time error/interrupt handler 830 (FIG. 8) services the error or interrupt by communicating with either a primary bus functional model 816 (FIG. 8) or a secondary bus functional model, or both, to execute one or more recovery routines at step 328. Method 300 may continue with a subsequent transaction by continuing execution at step 310.

Figure 4:
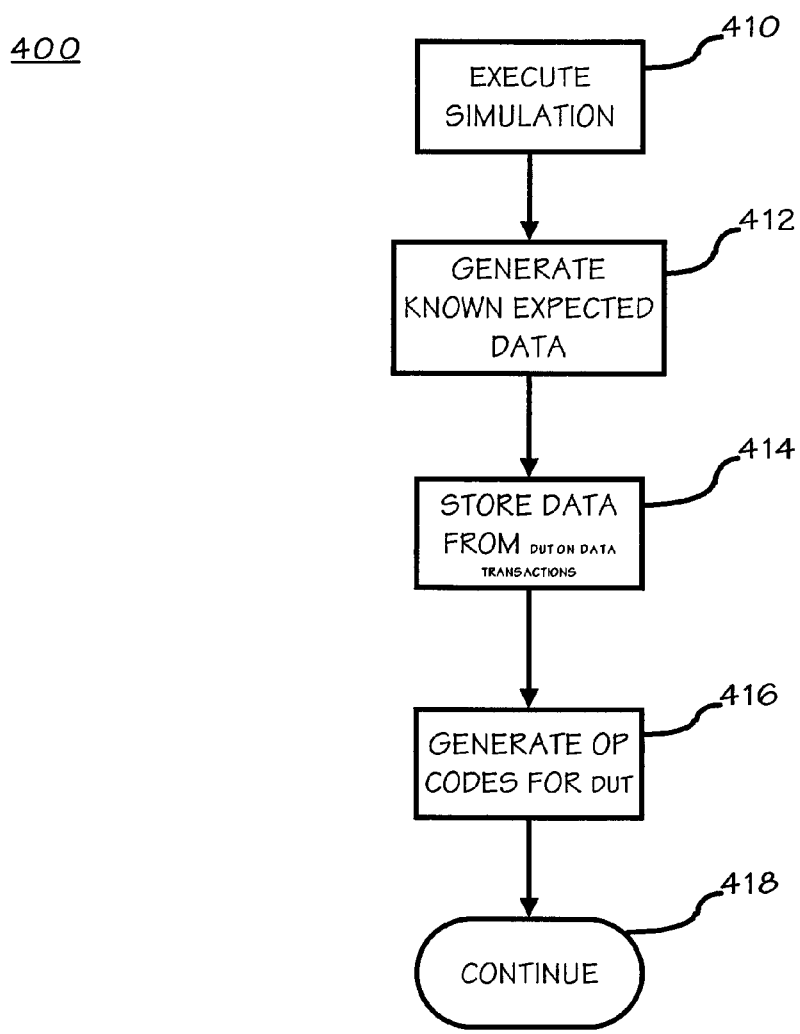
FIG. 4 is a flow diagram of method steps executed with a memory in a test bench simulation in accordance with the present invention.

In operation data may be obtained from either a data generator (as illustrated in FIG. 4) or external memory. Thus, while a data generator may be employed (FIG. 4), external memory may also be preloaded with instructions (or expect data) and be utilized to store data during bus transactions. Where a data generator is employed, by example, as illustrated in the flow diagram of FIG. 4, exemplary method steps executed by memory models are shown. Although method 400 of FIG. 4 shows a particular order, the order need not be limited to the order shown, and more or fewer steps may be executed, without providing substantial change to the scope of the present invention. During execution of the test bench simulation at step 410, memory model 832 (FIG. 8) or secondary memory model 834 (FIG. 8), or both, may execute any one or more of the following steps. Known expected data for data transactions is generated at step 412. Data from DUT 810 (FIG. 8, 612 of FIGS. 6 and 7) on data transactions is stored at step 414. Operation codes for DUT 810 are generated at step 416. Method 400 may continue executing at step 418. In an alternative embodiment of the invention, the order of step 414 and 416 are reversed. In such an embodiment, an operation code is first fetched to instruct DUT 810 what type of I/O instruction to perform before data is transferred on a read or write operation at step 414.

Although the invention has been described with a certain degree of particularity, it should be recognized that elements thereof may be altered by persons skilled in the art without departing from the spirit and scope of the invention. One of the embodiments of the invention can be implemented as sets of instructions resident in the main memory 204 of one or more computer systems configured generally as described in FIG. 2. Until required by the computer system, the set of instructions may be stored in another computer readable memory such as auxiliary memory 206 of FIG. 2, for example in a hard disk drive or in a removable memory such as an optical disk for utilization in a CD-ROM drive, a floppy disk for utilization in a floppy disk drive, a floppy-optical disk for utilization in a floppy-optical drive, or a personal computer memory card for utilization in a personal computer card slot. Further, the set of instructions can be stored in the memory of another computer and transmitted over a local area network or a wide area network, such as the Internet, when desired by the user. Additionally, the instructions may be transmitted over a network in the form of an applet (a program executed from within another application) or a servlet (an applet executed by a server) that is interpreted or compiled after transmission to the computer system rather than prior to transmission. One skilled in the art would appreciate that the physical storage of the sets of instructions or applets physically changes the medium upon which it is stored electrically, magnetically, chemically, physically, optically or holographically so that the medium carries computer readable information.

Referring now to FIG. 5, a flow diagram illustrating an exemplary data structure 500 of the present invention. As first illustrated in FIG. 1, the data structure 100 includes various programmable and selectable blocks. These blocks may include parameters 110, including, for example: device bus arbitration, interrupt generation, parity error generation, data sequence generation, and data packet timing control. Additionally, a configuration 112 data block may be implemented in the data structure 100, including for example: the bus interface type, device identification, device function, data bus width, and a bus timing specification. It is also preferred to include a data capture 116 block, including for example: the device identification (DEVICE ID), the data direction type, and the data transaction type. These and other data blocks may be utilized to create transaction influences in a test bench environment.

FIG. 6 illustrates the interaction of simulation instructions in accordance with the data structure 100 (transaction influences) for operation via the state machine 120, 122 (FIG. 1) of the present invention. In this fashion the data structure may be used to simulate a DUT/bus configuration in a test bench environment without requiring substantial alteration of the data structure 100.

Referring now to FIG. 7, wherein the data structure 100 of the present invention is utilized in the operation of a test bench environment. A DUT 612 is instantiated with several instances of the data structure 100. In this fashion the present invention may be reutilized to test various DUT/bus systems in a test bench environment.

Referring now to FIG. 8, a block diagram of a simulation test bench environment which may be utilized with the data structure 100 of the present invention. Test bench environment 100 is provided for emulating the specified operation of an integrated circuit (or the like). A device under test (DUT) 810 (612, FIGS. 6 and 7) is a hardware circuit, typically an integrated circuit (IC) that interfaces with test bench environment 800 so that its operation may be tested and verified. A primary bus 812 and a secondary bus 820 are coupled to DUT 810 to provide a channel for high-level communication with DUT 810. Each of primary and secondary bus 812 and 820 may include at least one or more data structures 100 of the present invention. For example, a primary bus 812 may include a first type of data structure of a primary bus functional model (BFM-1) 100', up to N number of primary bus functional models (BFM-N) 100'$_N$. Likewise, secondary bus 820 may include a second type of data structure of a secondary bus functional model (BFM-1) 100", up to N number of secondary bus functional models (BFM-N) 100"$_N$. Each of the bus functional models 100' and 100" execute high-level bus transactions to and from DUT 810. In addition to the bus functional models, each of primary bus 812 and secondary bus 820 includes blocks dedicated to verifying both timing and functional operation bus specifications. A real-time data checker 828 is further provided to compare data and parity integrity during input/output (I/O) transactions across each of primary bus 812 and secondary bus 820 to expected data and to report any miscompares or corruption in real-time during simulation runtime. In the event of a system error or interrupt condition, a dedicated real-time error/interrupt handler 830 is provided to service the error or interrupt by communicating with either primary bus models 100' or secondary bus models 100", or both, to execute specific recovery routines. A system memory model 832 is coupled with primary bus models 100', and a secondary memory model 834 is coupled with secondary bus models 100", with each capable of being used to generate known expected data for data transactions, to store data from DUT 810 on data transactions, and to generate instructional data for the DUT 810. In one embodiment of the present invention, primary bus 810 is compliant with a Peripheral Component Interconnect (PCI) bus standard, and secondary bus 820 is compliant with a Small Computer System Interface (SCSI) standard for testing DUT 810 where DUT is an integrated circuit capable of communicating over both a PCI bus and a SCSI bus. One having skill in the art would appreciate after having the benefit of the present disclosure that the invention need not be limited to the bus standards described herein and that other bus standards may be utilized without providing substantial change to the spirit or to the scope of the present invention.

It is believed that the method and apparatus for a multi-purpose configurable bus independent simulation bus functional model of the present invention and many of its attendant advantages will be understood by the forgoing description, and it will be apparent that various changes may be made in the form, construction and arrangement of the data structure and components thereof without departing from the scope and spirit of the invention or without sacrificing all of its material advantages, the form herein before described being merely an explanatory embodiment thereof. It is the intention of the following claims to encompass and include such changes.

What is claimed is:

1. An apparatus, comprising:
    a bus interface for interfacing with a circuit to be tested;
    a multipurpose bus functional model device having a configurable block data structure including at least one or more of the following functional blocks: parameters, configuration, transactions, data capture; and
    a state machine in operation with said multipurpose bus functional model device for interfacing with said bus interface and said circuit to be tested such that said circuit may be instantiated in a test bench environment along with said multipurpose bus functional model device having a configurable block data structure, said state machine including at least one of a master cycle generator and a slave cycle generator.

2. The apparatus of claim 1, wherein said data structure parameter data block includes at least two of the following: device bus arbitration, interrupt generation, parity error generation, data sequence generation, and data packet timing control.

3. The apparatus of claim 2, wherein said data structure configuration data block includes at least two of the following: bus interface type, device identification, device function type, data bus width, and a bus timing specification.

4. The apparatus of claim 3, wherein said data structure data capture block includes the bus data and at least two of the following: the device under test transaction identification, the data direction type, and the data transaction type.

5. The apparatus of claim 4, wherein said state machine includes a master cycle generator and a slave cycle generator.

6. The apparatus of claim 5, wherein said transaction data block of said data structure includes a data generator.

7. The apparatus as claimed in claim 1, said bus interface having a corresponding timing and protocol checker for verifying timing and functional operations of the circuit to be tested.

8. The apparatus as claimed in claim 1, further comprising a data checker for comparing data and parity integrity during transactions across said bus interface, and for reporting at least one of data miscompares and corruption during testing of a circuit under instantiation.

9. The apparatus as claimed in claim 1, further comprising an error and interrupt handler for servicing at least one of an error and an interrupt by communicating with said multipurpose bus functional model during execution of a recovery routine.

10. The apparatus as claimed in claim 1, further comprising a memory coupled to said multipurpose bus functional model bus interface.

11. The apparatus as claimed in claim 1, said bus interface is compliant with a PCI standard.

12. The apparatus as claimed in claim 1, said bus interface is compliant with a SCSI standard.

13. The apparatus as claimed in claim 1, said data structure forms at least one or more functional models using host drivers for communicating with the circuit to be tested using high level I/O instructions and commands.

14. An apparatus, comprising:
   first means for interfacing with a circuit to be tested; and
   second means for interfacing with the circuit to be tested; and
   each of said first and second interfacing means having a corresponding at least one or more means, respectively, for executing multipurpose data structure block test transactions with the circuit to be tested, said multipurpose block test transactions programmable by a user for said circuit to be tested.

15. The apparatus as claimed in claim 14, each of said first and second interfacing means having corresponding means for verifying timing and functional operations of the circuit to be tested.

16. The apparatus as claimed in claim 14, further comprising means for comparing data and parity integrity during transactions across each of said first and second interfacing means, and for reporting at least one of data miscompares or corruption during testing of the circuit to be tested.

17. The apparatus as claimed in claim 14, further comprising means for servicing an error or an interrupt by communicating with at least one executing means of at least one of said first and second interfacing means, said servicing means for executing a recovery routine.

18. An apparatus as claimed in claim 14, further comprising a means for storing information being coupled to at least one of said first and second interfacing means.

19. The apparatus as claimed in claim 14, at least one of said first and second interfacing means being compliant with a PCI standard.

20. The apparatus as claimed in claim 14, at least one of said first and second interfacing means being compliant with a SCSI standard.

21. The apparatus as claimed in claim 14, said at least one or more executing means using host drivers for communicating with the circuit to be tested using high level I/O instructions and commands.

22. The apparatus of claim 14, wherein each of said first and second interfacing means includes a data structure data capture block that includes bus data, device under test transaction identification, data direction type, and data transaction type.

23. The apparatus of claim 14, wherein each of said first and second interfacing means includes a state machine, each of said state machines includes a slave cycle generator.

24. The apparatus of claim 14, wherein each of said first and second interfacing means includes a state machine, each of said state machines includes a master cycle generator.

25. The apparatus of claim 23, wherein each of said first and second interfacing means includes a state machine, each of said state machines includes a master cycle generator.

26. An apparatus for testing a circuit, comprising:
   means for generating known expected data for testing a circuit;
   means for storing data from the circuit on data transactions with the circuit; and
   means for generating an operation code for execution by the circuit; and
   means for testing the circuit, said testing means being selected from the group consisting of means for bus arbitration, interrupt generation, parity error generation, data sequence generation, data packet timing control, bus interface type, bus device identification, bus device function, data bus width, bus timing specifications, data transaction identification, data direction type, and data transaction type.

27. The apparatus as claimed in claim 22, said means for generating known expected data comprising a memory structure.

28. The apparatus as claimed in claim 22, said storing means comprising a memory structure.

29. The apparatus as claimed in claim 22, said means for generating an operation code comprising a memory structure.

30. The apparatus of claim 26, wherein said testing means includes means for data timing packet control.

31. The apparatus of claim 26, wherein said testing means includes means for bus interface type.

32. The apparatus of claim 26, wherein said testing means includes means for bus timing specifications.

33. The apparatus of claim 26, wherein said testing means includes means for data direction type.

34. An apparatus for testing a circuit, comprising:
   a bus interface coupleable to said circuit;
   at least one or more bus functional models consisting essentially of a data block structure coupled to said bus interface, said data block structure including at least one of the group consisting of data sequence generation and data direction type and including at least one of the group consisting of data packet timing control and bus interface type.

35. The apparatus of claim 34, further including a device selected from the group consisting of a timing and protocol checker, a data checker, a real-time error and interrupt handler, and a memory model.

36. The apparatus of claim 34, said data block structure including at least one of the group consisting of bus device function, bus timing specifications and data transaction identification.

37. The apparatus of claim 36, said data block structure further including bus arbitration, interrupt generation, parity error generation, bus device identification, data bus width, and data transaction type.

38. An apparatus, comprising:
- a bus interface for interfacing with a circuit to be tested;
- a first multipurpose bus functional model device having a configurable block data structure including at least one or more of the following functional blocks: parameters, configuration, transactions, data capture;
- a first state machine in operation with said first multipurpose bus functional model device for interfacing with said bus interface and said circuit to be tested such that said circuit may be instantiated in a test bench environment along with said first multipurpose bus functional model device having a configurable block data structure;
- a second multipurpose bus functional model device having a configurable block data structure including at least one or more of the following functional blocks: parameters, configuration, transactions, data capture; and
- a second state machine in operation with said second multipurpose bus functional model device for interfacing with said circuit to be tested such that said circuit may be instantiated in a test bench environment along with said second multipurpose bus functional model device having a configurable block data structure.

39. The apparatus of claim 38, further including an arbiter for controlling first and second multipurpose bus functional model devices.

40. The apparatus of claim 38, wherein at least one of said first and second state machines has a slave cycle generator.

41. The apparatus of claim 40, wherein at least one of said first and second state machines has a master cycle generator.

42. The apparatus of claim 38, wherein each of the first and second multipurpose bus functional model devices executes simulation, generates known expected data, stores data from the circuit to be tested, and generates op codes for the circuit to be tested.

43. The apparatus of claim 42, wherein each of the first and second multipurpose bus functional model devices has a configurable block data structure including parameters, configuration, transactions, and data capture blocks.

44. The apparatus of claim 43, wherein the parameters block includes device bus arbitration, interrupt generation, parity error generation, data sequence generation, and packet timing control.

45. The apparatus of claim 43, wherein the configuration block includes bus interface type, device identification, device function, address range, data bus width, and bus timing specification.

46. The apparatus of claim 43, wherein the data capture block includes device identification, direction type, and transaction type.

47. The apparatus of claim 38, wherein the first and second multipurpose bus functional model devices share a real-time error and interrupt handler and a real-time data checker.

48. The apparatus of claim 47, wherein each of the first and second multipurpose bus functional model devices has a timing and protocol checker model.

49. The apparatus of claim 48, wherein each of the first and second multipurpose bus functional model devices has a master cycle generator and a slave cycle generator.

* * * * *